United States Patent [19]

Brown et al.

[11] Patent Number: 4,713,104
[45] Date of Patent: Dec. 15, 1987

[54] QUARTZ GLASS CRUCIBLES

[75] Inventors: David R. Brown, Beverly, Mass.; Charles E. Frost, Jr., Exeter; Kenneth A. White, Raymond, both of N.H.

[73] Assignee: GTE Products Corporation, Stamford, Conn.

[21] Appl. No.: 846,190

[22] Filed: Mar. 31, 1986

[51] Int. Cl.⁴ ............................................. C03B 19/04
[52] U.S. Cl. ........................................ 65/18.1; 65/71; 65/144
[58] Field of Search ................... 65/18.1, 18.2, 71, 81, 65/144, 99.4, 157, 182.3, 302; 264/56, 57, 114, 102, 101, 311, DIG. 78; 425/DIG. 60

[56] References Cited

U.S. PATENT DOCUMENTS

| 2,026,940 | 1/1936 | Hendryx | 264/DIG. 78 |
| 3,038,199 | 6/1962 | Bartow | 264/102 X |
| 4,266,925 | 5/1981 | Book | 425/DIG. 60 |
| 4,370,294 | 1/1983 | Franken | 264/101 X |
| 4,416,680 | 11/1983 | Bruning | 65/144 |

Primary Examiner—Kenneth M. Schor
Attorney, Agent, or Firm—James Theodosopoulos

[57] ABSTRACT

A flat-bottomed quartz glass crucible for the manufacture of monocrystalline silicon is made by disposing granular quartz particles on a flat base in a cylindrical mold. A vacuum is drawn on the particles through vacuum holes in the base to retain the particles thereon while the base and mold are rotated, and while the particles are heated to fuse them into a quartz glass crucible shape.

2 Claims, 2 Drawing Figures

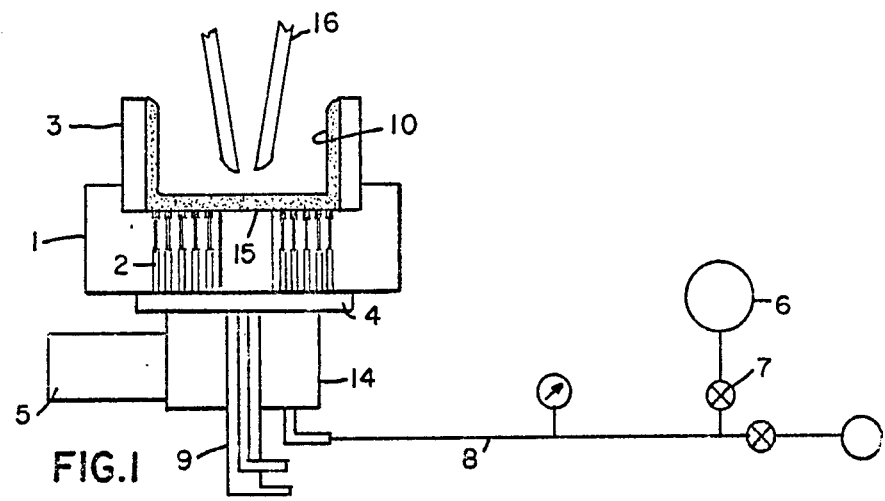
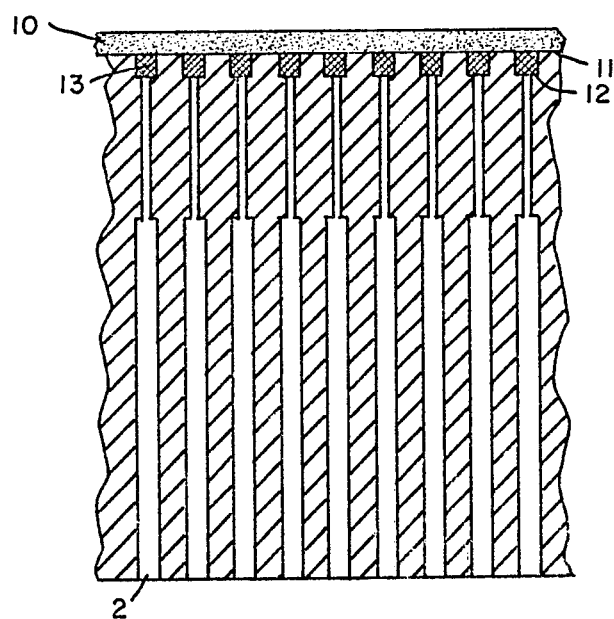
FIG.1
FIG.2

QUARTZ GLASS CRUCIBLES

This invention concerns quartz glass crucibles for use in making monocrystalline silicon for semiconductors. A method of making such crucibles involves disposing granular quartz particles on the interior surface of a rotating cylindrical mold, drawing a vacuum on the granular quartz through the mold in order to remove gas bubbles from the quartz, and then heating and melting an inner layer of the quartz to fuse the quartz into a crucible shape. Such a method is disclosed in U.S. Pat. No. 4,416,680. The crucibles made by such a method have a substantially curved bottom, as shown in the patent drawing.

This invention is concerned with making a crucible having a substantially flat bottom. Such a crucible can be used advantageously in the manufacture of monocrystalline silicon by providing silicon having improved properties. The improvement is probably due to a decrease in thermal gradient currents occurring in the molten silicon during the drawing of the monocrystalline silicon therefrom.

In order to provide the substantially flat bottom, provision must be made to retain the granular quartz on the flat base of the rotating mold during the heating and melting of the quartz, so that centrifugal force does not throw the quartz against the walls of the mold. In the mold used in U.S. Pat. No. 4,416,680, the retention of quartz on the bottom is not a problem because the bottom is curved.

We have found that in order to retain the quartz on a flat bottom, there must be sufficient vacuum to hold the granular quartz there and overcome centrifugal force tending to throw the quartz outward. To accomplish this, the vacuum holes in the base must be larger than those disclosed in U.S. Pat. No. 4,416,680 where the hole size is small enough so that the granular quartz will bridge the opening in order to prevent clogging of the opening. In said patent, 0.5 mm holes are used, which are successfully bridged by the 160 to 250 micron size granular quartz disclosed in the patent.

In our invention, a larger hole is used than will be bridged by the granular quartz. We dispose a porous material in the hole such that vacuum is readily transmitted through the porous material, but the granular quartz will not pass through. Furthermore, the porous material is not readily clogged by the granular quartz.

The use of a non-porous material for the mold, with a porous material only in the vacuum holes as per this invention, is superior to the use of a porous material for the entire mold, the reason being that the useful life of a mold as per this invention is much longer than when substantially the entire mold is made of a porous material. Furthermore, our arrangement permits better distribution of the vacuum where it is needed more, that is to say, where centrifugal force is greater.

BRIEF DESCRIPTION OF THE DRAWING

In the drawing,

FIG. 1 shows apparatus that can be used in the practice of this invention.

FIG. 2 is an enlarged sectional view of a mold base showing the vacuum holes therethrough.

DESCRIPTION OF THE PREFERRED EMBODIMENTS

In one example of this invention, as shown in FIG. 1, the apparatus comprises a base 1 having flat upper surface 15 and having vacuum holes 2 through the base. The sides of the mold comprise an open-ended cylinder 3 resting in an undercut in base 1. Base 1 rests on metal plate 4 supported on spindle 14 through which vacuum can be transmitted to vacuum holes 2. Plate 4 and spindle 14 are rotated by motor 5. Vacuum is supplied to spindle 14 by vacuum pump 6 through valve 7 through pipe 8. Means 9 are provided for circulating cooling water within spindle 14.

In one embodiment, base 1 was made of graphite and was 23" in diameter by 6" thick. The undercut region in which cylinder 3 rested, which also comprised flat surface 15, was 20.1" in diameter by ¼" deep. There were 1,104 holes 2 through base 1 in twenty circular rows. The first circular row comprised sixteen equally spaced holes on a 4" body circle. It was not necessary to locate any vacuum holes within the 4" body circle because centrifugal force thereat was slight. Thus, granular quartz 10 could be satisfactorily retained therein by means of inverted frustums of granular quartz drawn and held by vacuum which extend above holes 2 in the first circular row. The second circular row also had sixteen equally spaced holes staggered or located between the holes in the first row, on a 5" body circle. The third circular row also had sixteen equally spaced staggered holes on a 6" body circle. Thus these circular rows were ½" apart, edge-to-edge, which spacing was maintained for the first ten rows. Row four had thirty-two equally spaced holes and rows five through twenty each had sixty-four equally spaced holes. In rows five through ten, the holes were not staggered but were radially aligned. Row eleven was on a 13½" body circle, and the edge-to-edge spacing between circular rows for rows eleven through twenty was reduced to ¼", the holes in adjacent rows being staggered. Row twenty was on an 18" body circle.

As shown in FIG. 2, each hole 2 had a diameter of 3/16" for a distance of ¼" below upper surface 11 of base 2 and then a reduced diameter of ⅛" for a distance of 1½". The reason for the reduced diameter was to provide a shoulder 12 on which porous graphite plug 13 would rest when inserted into the hole. Each hole then expanded to a diameter of ¼" for the remaining thickness of base 2 in order to not unnecessarily constrict the vacuum passages.

In this example cylinder 3 had an outside diameter of 20", a thickness of 1" and a height of 12". There were no vacuum holes in cylinder 3 because the crucible was going to be cut down in height to about 3" and the vacuum being drawn through holes 2 in base 1 could adequately remove gas bubbles from the 3" height.

The arrangement of metal plate 4 and spindle 14 was such that there was considerable surface contact therebetween, so that water cooled spindle 14 would also cool plate 4, while vacuum through plate 4 could still be drawn. The arrangement of base 1 and plate 4 was similar, i.e., to provide cooling of base 1 while still providing for the vacuum. Thus, the bottom surface of base 1 had grooves or passages therein (not shown) leading from the vacuum opening in plate 4 to all the vacuum holes 2 in base 1. Such grooves permitted surface contact of plate 4 to base 1 between the grooves in order to provide cooling surfaces therebetween. Similarly, there was surface contact between plate 4 and base 1 within the 4" circle at the center of base 1 where there were no vacuum holes.

This invention permits use of a dense graphite material machined into shape for the mold base and cylinders, such as high purity graphite 890 RL having a density of 1.68 gm/cc made by Airco Carbon, St. Marys, Pa. Such a material is more oxidation resistant and lasts much longer than the porous graphite referred to in U.S. Pat. No. 4,416,680. A fibrous, very porous graphite, however, was used for plugs 13. In this example, plugs 13 were made of Fiberform, which is made by Fiber Materials, Inc., Biddeford, Me. Fiberform is a low density (11.9 lbs./cu.ft), rigid, carbon bonded carbon fiber insulation material designed to operate at temperatures up to 5000° F. in a vacuum or inert environment and up to 660° F. in an oxidizing atmosphere. Plugs 13 were cemented in place with a carbonaceous cement such as Ucar C-34 made by Union Carbide Corporation, Danbury, Conn.

The vacuum tends to hold the granular quartz in the shape of an inverted frustum at the top of each hole 2, the angle of the frustum being about 45°. In order to ensure that the quartz is held in place on the flat surface of base 1, without being spun off by centrifugal force during rotation, holes 2 cannot be spaced too far apart, relative to their diameter. In the embodiment above, the maximum edge-to-edge spacing between two adjacent holes 2 in a circular row was 1". Thus bridging of the granular quartz frustums at these two holes occurred at a height above surface of about ⅞" which is about 1½ times the diameter of a hole 2. Said maximum edge-to-edge spacing should not substantially exceed said amount of 1¼.

In one example, the apparatus was prepared as follows. Base 1 was mounted on metal plate 4 and spindle 14, as shown in FIG. 1, and cylinder 3 was placed on base 1. Rotation was commenced and granular quartz particles were poured into cylinder 3. A suitable jig shaped the granular quartz particles into a thick layer, as shown in FIG. 1, about ⅞" thick. With vacuum and rotation being maintained, about half of the thickness of the layer of granular quartz particles 10 was melted and fused into quartz glass by heat from electrodes 10. Most of the remaining half of the layer thickness, except for a thin coating of sintered quartz particles adhering to the fused quartz, remained unfused and unsintered as loose particles, thus facilitating removal of the rough quartz glass crucible shape from the mold. The rough crucible was machined into a finished crucible by removing the loose particles, cutting off the upper portion of the crucible shape to produce the desired height, and grinding, beveling or polishing the upper edge of the crucible.

An 18" diameter substantially flat-bottomed crucible made from the above mold had a flat bottom of about 15" diameter and was slightly radiused for the remaining 1½" perimeter. Because the flat bottom is advantageous in a semi-continuous process of drawing monocrystalline silicon, the crucible height could be considerably less than that of prior art crucibles having a curved bottom. In this example, the height of the finished, cut-down crucible was only three inches. About 5/6ths of the diameter of the crucible bottom was substantially flat.

We claim:

1. A method of making a quartz glass crucible from granular quartz particles comprising the steps of:
   providing a base having an upper flat surface thereon, the base having holes therethrough through which a vacuum can be drawn, the diameters of the holes at said upper surface being greater than can be bridged by the granular quartz particles, the holes at said upper surface being filled with a porous material through which a vacuum can be drawn but through which the granular quartz particles will not pass;
   placing an open-ended cylindrical mold on the base;
   disposing a thick layer of granular quartz particles on the flat surface of the base and on the cylindrical mold;
   rotating the base and cylindrical mold while drawing a vacuum on the granular quartz particles through the holes in the base, the granular quartz particles on the flat surface of the base being held in place by means of the vacuum;
   heating the granular quartz particles, while maintaining the rotation and vacuum, to melt and fuse an inner portion of the thick layer of granular quartz particles to form a quartz glass crucible shape having a substantially flat bottom;
   removing the quartz glass crucible shape from the base and cylindrical mold; and
   machining the quartz glass crucible shape into a finished crucible.
   the method including the provision that holes are provided only in the base and not in the cylindrical mold and that enough vacuum is drawn though said holes to remove bubbles from the entire mass of the quarts particles.

2. The method of claim 1 including the step of cutting off the upper portion of the quartz glass crucible shape.

* * * * *